United States Patent [19]

Itoh et al.

[11] 3,852,801

[45] Dec. 3, 1974

[54] CHARGE-COUPLED SEMICONDUCTOR DEVICE PROVIDED WITH BIASING CHARGES

[75] Inventors: Yokichi Itoh, Hachioji; Hideo Sunami, Musashino; Yoshiaki Kamigaki, Kokubunji, all of Japan

[73] Assignee: Hitachi, Ltd., Tokyo, Japan

[22] Filed: Dec. 29, 1972

[21] Appl. No.: 319,612

[30] Foreign Application Priority Data

Dec. 29, 1971 Japan .................................. 46-1656

[52] U.S. Cl. ................................ 357/24, 307/221 D
[51] Int. Cl. ............................................ H01l 11/14
[58] Field of Search ............. 317/235 G; 307/221 D

[56] References Cited

UNITED STATES PATENTS

| | | | |
|---|---|---|---|
| 3,676,715 | 7/1972 | Brojdo | 317/235 |
| 3,739,240 | 6/1973 | Krambeck | 317/235 |

OTHER PUBLICATIONS

IEEE Trans On Electron Devices, "Self-Scanned Image Sensors Based on Charge Transfer by Bucket--Brigade Method" by Weimer et al., Nov. 1971, pages 996–1003.

*Primary Examiner*—Martin H. Edlow
*Attorney, Agent, or Firm*—Craig & Antonelli

[57] ABSTRACT

A charge-coupled semiconductor device comprises a p-type semiconductor substrate, an n-type semiconductive layer formed 3.0 in thickness upon one major surface of the p-type semiconductive substrate, an $SiO_2$ layer formed upon the n-type semiconductor layer, and a plurality of electrodes formed upon the $SiO_2$ layer and spaced apart from each other by a predetermined distance in the lengthwise direction. When the amount of charge carriers which are transferred along the interface between the n-type semiconductor layer and the $SiO_2$ layer becomes less than one-half of the maximum charge which may be stored in the n-type semiconductor layer immediately below the electrode to which is applied a pulse voltage of −20V, the edge of the potential well-formed immediately below the electrode comes into contact with the p-type semiconductor substrate, so that a charge equal to one-half of the maximum storable charge may be injected from the p-type semiconductor substrate. Thus, the attenuation of the charge may be compensated during the charge transfer and storage.

21 Claims, 13 Drawing Figures

CHARGE-COUPLED SEMICONDUCTOR DEVICE PROVIDED WITH BIASING CHARGES

BACKGROUND OF THE INVENTION

The present invention relates to generally a charge-coupled semiconductor device and, more particularly, a charge-coupled semiconductor device provided with means for injecting the charge carriers so as bias the charge carriers to be transferred through the semiconductor device. According to the present invention, the charge carrier transfer efficiency may be remarkably increased.

Charge-coupled semiconductor devices have recently found wide applications in shift registers, image display devices and the like because they are of simple construction and easy to fabricate. The prior art MIS charge-coupled semiconductive device generally comprises a semiconductor substrate, a thin insulating film formed upon one major surface of the semiconductor substrate, means for injecting the charge carriers into the semiconductor substrate, a plurality of electrodes formed upon the insulating film and spaced apart lengthwise thereof from each other by a predetermined distance, so as to store the injected charge carriers and to transfer them along the interface between the semiconductor substrate and the insulating film, means, electrically coupled to the electrodes, so as to produce an electric field to thereby transfer the charge carriers, and means for detecting the charge carriers transferred through the charge-coupled semiconductor device at one end thereof.

The minority carriers are used as charge carriers to be transferred, because the semiconductor is adapted to provide such minority carriers. More particularly, holes are used as charge carriers when the semiconductor used is of n-type, whereas electrons are used in a semiconductor of p-type.

Next, the mode of operation of the prior art charge-coupled semiconductor device of the type described above will be explained briefly. When a DC voltage is applied to one of the electrodes on the insulating layer, a depletion or space-charge region is formed in the interface between the semiconductor substrate and the insulating layer between the electrode and a region formed in the substrate which function as the other electrode. Since the depletion region is formed immediately below the electrode to which is applied a DC voltage, a potential well is formed. Under these conditions, the charge carriers may be injected into the semiconductor substrate by applying a forward voltage across the p-n junction, causing an avalanche breakdown in case of a MOS semiconductor device, or by illuminating a p-n junction. These minority carriers, thus liberated, are collected in the potential well.

Thereafter, a DC voltage higher than that applied to the first electrode is applied to the next electrode adjacent to the first electrode, so that a deeper potential well may be formed immediately below the second electrode. Because of their inherent tendency for moving into a deeper potential well, the minority carriers are moved or transferred into the deeper potential well. After the charge or minority carriers are transferred to the region immediately below the next electrode, the voltage applied to the first electrode is cut off, whereas the voltage applied to the second electrode is decreased to the level of the voltage applied to the first electrode. In like manner the minority or charge carriers may be transferred from the region immediately below one electrode to the region immediately below the next electrode through the charge-coupled semiconductor device toward the output terminal.

The fundamental structure and mode of operation of the charge-coupled semiconductor device are disclosed in detail in, for example, "Charge-Coupled Semiconductor Devices," by W. S. Boyle and G. E. Smith, and "Experimental Verification of the Charge-Coupled Device Concept" by G. F. Amelio, M. F. Tompsett and G. E. Smith, the *Bell System Technical Journal*, Vol. 149, No. 4, April, 1970, pp. 587–600.

In the charge-coupled semiconductor devices of the type described, it is inevitable that some of the charge or minority carriers will not be transferred from the region immediately below one electrode to the region immediately below the next electrode, but will remain in the region immediately below the first electrode. In order to take full advantage of the charge-coupled semiconductor devices, it is, of course, preferable that the device has a charge carrier transfer efficiency (which is defined as the ratio of the number of charge or minority carriers transferred, from the region immediately below one electrode to the region immediately below the next electrode, to the total number of charge or minority carriers in the region immediately below said one electrode) close to 100 percent. The reason is that when the charge carrier transfer efficiency is 99 percent, the charge carriers which have been transferred across 100 electrodes are reduced to the order of 37 percent. That is, the maximum charge Qmax which may be stored in the region immediately below one electrode and to be transferred into the region immediately below the next electrode is dependent upon the voltage to be applied to the electrode and the area thereof. The maximum charge Qmax may be stored in the region immediately below an electrode which is located adjacent to an input terminal, but as the charge carrier transfer is continued the number of the charge or minority carriers which have remained in the preceding region and the number of charge or minority carriers which have been neutralized are increased because of the reasons described hereinbefore. Therefore it becomes extremely difficult to discriminate the signal which is the charge or minority carriers transferred through the device in the manner described above from noise. Furthermore, as the number of electrodes is increased, that is, as the number of charge or minority carriers is decreased, the transfer efficiency is reduced, so that the charge or minority carriers collected at the output terminal are considerably reduced in number. The prior art charge-coupled semiconductor devices have the above inherent defects. Therefore, in the prior art charge-coupled semiconductor devices, the number of electrodes used is limited to a number considerably smaller than the usable number theoretically calculated from the charge carrier transfer efficiency based upon the maximum storable charge Qmax, that is, the initial charge carrier transfer efficiency so that the charge or minority carriers transferred through the device may be detected at the output terminal.

SUMMARY OF THE INVENTION

The present invention was therefore made in order to overcome the above defects and problems encountered in the prior art charge-coupled semiconductor devices.

One of the objects of the present invention is, therefore, to provide a novel charge-coupled semiconductor device in which the charge or minority carriers which will be referred to as "the signal charge" in this specification hereinafter and which have been transferred along the surface of the semiconductor substrate below a plurality of electrodes which will be referred to as the "carrier transfer electrodes" may be detected and derived as a clear output signal.

Another object of the present invention is to provide a novel charge-coupled semiconductor device having a high charge carrier transfer efficiency, so that the attenuation of the signal charge may be minimized and the charge transfer electrodes used may be increased to a number hitherto unobtainable by the prior art charge-coupled semiconductor devices.

To accomplish the above and other objects of the present invention, the bias charge corresponding to the signal charge is automatically supplied into the space-charge or depletion region formed in the region of a semiconductor layer immediately below a charge transfer electrode to which is applied a pulse or voltage. Briefly stated, the novel feature of the present invention resides in the fact that if the charge stored within a potential well is less than a predetermined normalized charge when a predetermined voltage is applied to a charge transfer electrode, the potential well may be made to come into contact with a p-n junction or ohmic junction formed between a semiconductive layer and a conductive layer (for example, a layer of a semiconductor with a semiconductive polarity different from that of the first-mentioned semiconductive layer or a metallic layer) so that the bias charge may be automatically injected into the first-mentioned semiconductive layer immediately below the charge transfer electrode when the charge transfer pulse is applied thereto.

According to the present invention, not only the attenuation of the signal charge is minimized but also the charge carrier transfer efficiency is considerably increased. Furthermore, the signal for causing the injection of the bias charge may be applied to the signal charge transfer electrode. This means that the signal charge transfer pulse may be used as the bias charge injection signal so that it is not necessary to apply the bias charge injection signal to the p-n junction across which the bias charge carriers are injected in precise timing relation with the signal charge transfer pulses applied to the charge transfer electrodes. Therefore, the charge-coupled semiconductor devices, in accordance with the present invention, may be designed remarkably simple in construction and compact in size.

The above and other objects, features and advantages of the present invention will become more apparent from the following description of some preferred embodiments thereof when taken in conjunction with the accompanying drawing.

BRIEF DESCRIPTION OF THE DRAWING

The same reference numerals are used to designate the same parts throughout the figures.

DESCRIPTION OF THE PREFERRED EMBODIMENTS

Figure 1:
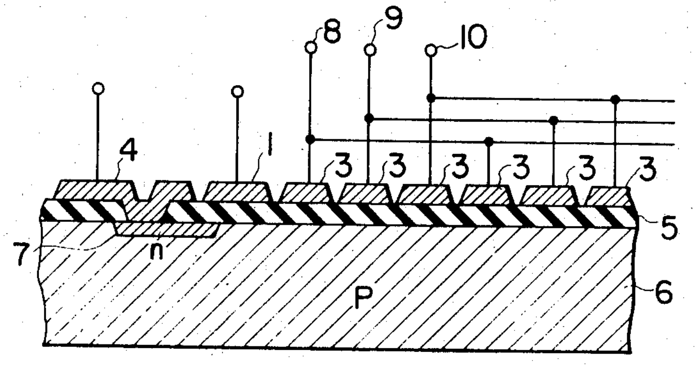
FIG. 1 is a fragmentary sectional view of one example of the prior art charge-coupled semiconductor device.
Figure 2:
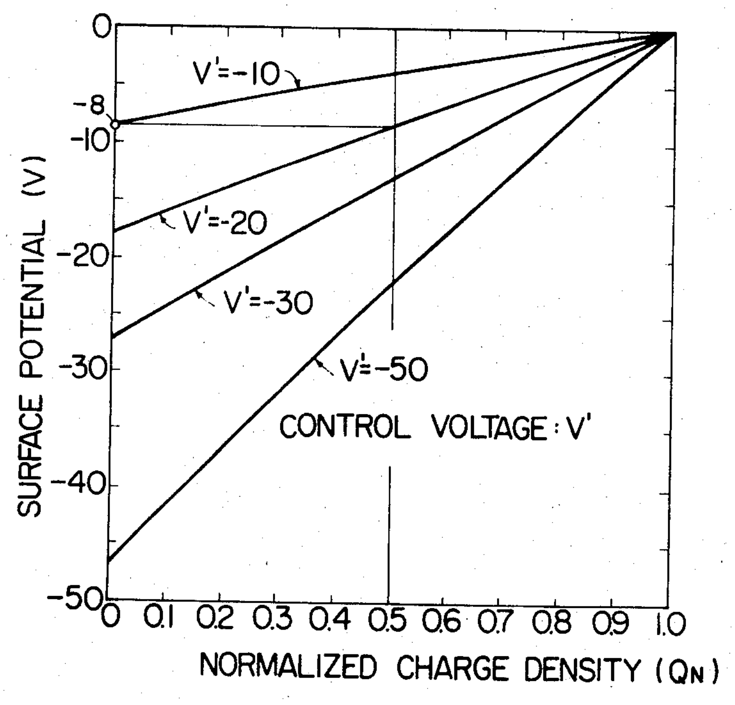
FIG. 2 is a graph illustrating the relation between the normalized charge and the surface potential.
Figure 3:
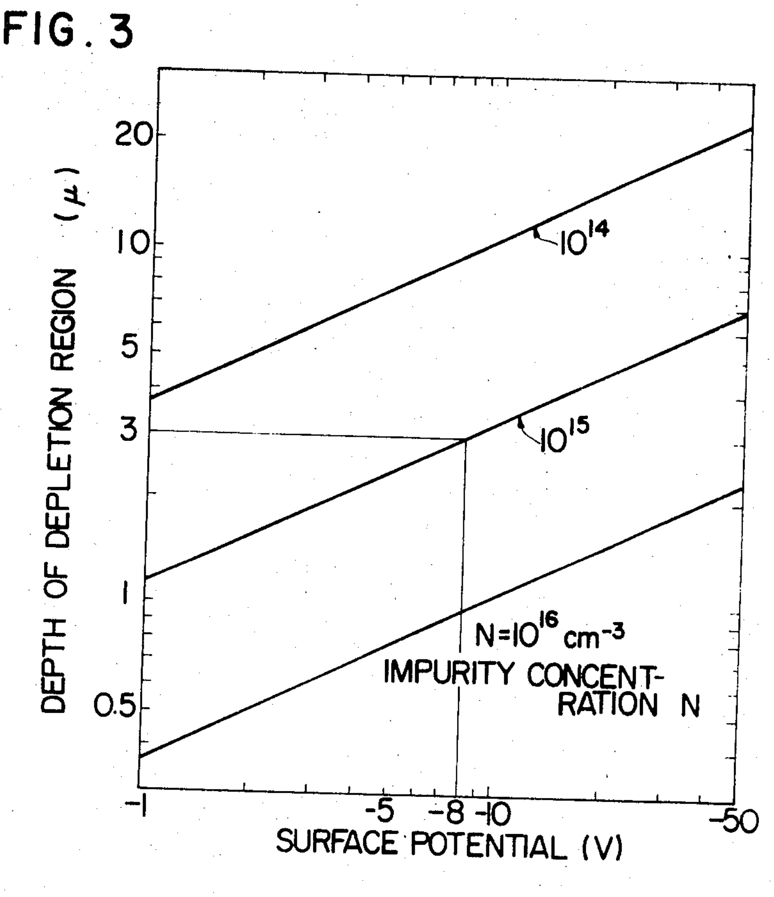
FIG. 3 is a graph illustrating the relation between the surface potential and the depth of the depletion or space-charge region.

Prior Art, FIGS. 1, 2 and 3

Prior to the description of the preferred embodiments of the present invention, the prior art charge-coupled semiconductor device will be briefly described with reference to FIGS. 1, 2 and 3 in order to more clearly point out the defects and problems encountered in the prior art devices.

FIG. 1 shows a sectional view of the prior art charge-coupled semiconductor device based upon the method in which the signal charge is injected across the p-n junction. A voltage is impressed across a region 7 whose polarity or type is different from that of a substrate and an input gate electrode 1, so that there may be formed a channel through which the charges are injected under the transfer electrode 1. In response to the three-phase pulse trains applied to terminals 8, 9 and 10 each connected to a respective transfer electrode 3 spaced apart from each other by two transfer electrodes, as shown in FIG. 1, the injected charges are transferred below the transfer electrodes 3 from the region below one transfer electrode to a region under the next transfer electrode.

The maximum charge Qmax which may be stored and transferred below the transfer electrodes 3 is dependent upon the area of the electrode and the voltage applied thereto as explained hereinbefore.

FIG. 2 is a graph illustrating the relations among the surface potential $\phi_s$ presenting the magnitude of the curvature of the energy band on the surface of the semiconductor substrate below the transfer electrodes, the normalized charge $Q_N$ ($Q_N = Q/Q_{max}$) where Q is the stored charge, and the control voltage V' which is equal to the voltage applied to the electrode minus the flat band voltage and the work function between the electrodes.

FIG. 3 is a graph illustrating the relation between the surface potential $\phi_s$ and the depth W of the depletion region formed below the surface of the semiconductor of a charge-coupled semiconductor device in which the donor concentration of the n-type semiconductor below the transfer electrodes is $10^{14}/cm^3$, $10^{15}/cm^3$ and $10^{16}/cm^3$ respectively.

In the charge-coupled semiconductor device of the type shown in FIG. 1, the maximum charge Qmax may be stored below the transfer electrode 3 adjacent to the input electrode, but in the charge transfer operation, the charge which is neutralized and remains in the region below the transfer electrode is increased, so that the quantity of the charge transferred across the regions below the transfer electrodes 3 is considerably reduced. As a result, it will become extremely difficult to detect the signal charge at the last transfer electrode or output terminal. Furthermore, as described hereinbefore, it is not preferable to increase the number of transfer electrodes in order to prevent the decrease in the charge carrier transfer efficiency.

Underlying Principle of the Invention

According to the underlying principle of the present invention, a semiconductor region of one polarity or a metallic layer is formed adjacent to the potential well formed in a semiconductor substrate of the other polarity below a charge transfer electrode so that the majority carriers in the first-mentioned semiconductive region or metallic layer is the usable charge to be stored and transferred and may consist of majority carriers. The semiconductor region of one polarity (which should be understood to include a metallic layer) is so formed that the edge of the depletion region which, in turn, forms the potential well, may be made to contact the semiconductor region of one polarity when the charge stored in the potential well becomes less than a predetermined normalized charge while a predetermined voltage is applied to the transfer electrode. Therefore, when the voltage is applied to the transfer electrode while the charge in the potential well is less than a predetermined normalized charge, the depletion region reaches the semiconductor region of one polarity so that the majority carriers in the semiconductor region of one polarity are injected until the normalized charge in the potential well becomes a predetermined level. Then, the depletion region is spaced apart from the semiconductor region of one polarity, so that the injection of the majority carriers is interrupted. Thus, according to the present invention, there may be provided a bias charge corresponding to a predetermined normalized charge, which is adjustable, even when there is no signal charge in the potential well. Furthermore, the bias charge described above serves to prevent the attenuation of the signal charge transferred. That is, the signal charge may be detected with a sufficiently high transfer efficiency even when the small charge signal is so attenuated in transfer that it becomes difficult to detect the charge signal.

The magnitude of the bias charge may be arbitrarily selected depending upon the magnitude of the signal charge under the condition that $$0 \leqq Q_n \leqq 1.$$

In this case, the stored charge Q is the sum of the signal charge Qs and the bias charge Q*b*. The bias charge may be determined by the control voltage V' which, in turn, is controlled by the voltage applied to the transfer electrodes, the control voltage application time, the densities of impurities doped into the semiconductor regions of one and the other polarities, and the positions of p-n junctions formed in the semiconductor regions.

Figure 4:
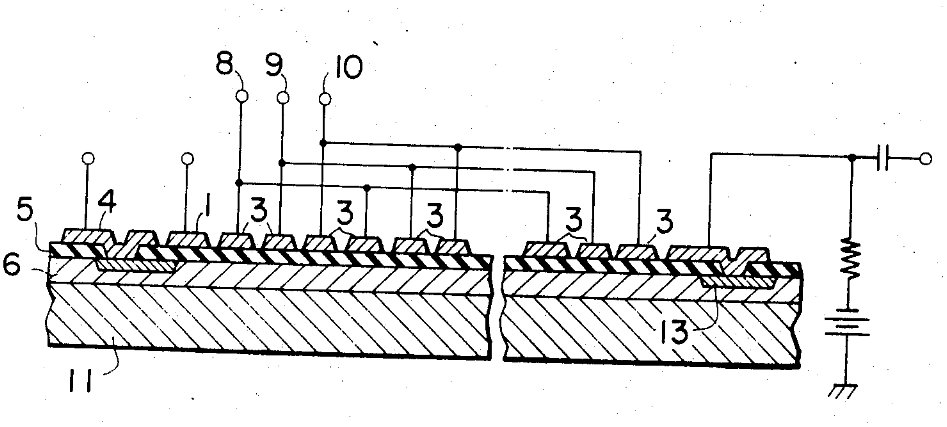
FIG. 4 is a fragmentary sectional view of a first embodiment of the present invention.
Figure 5:
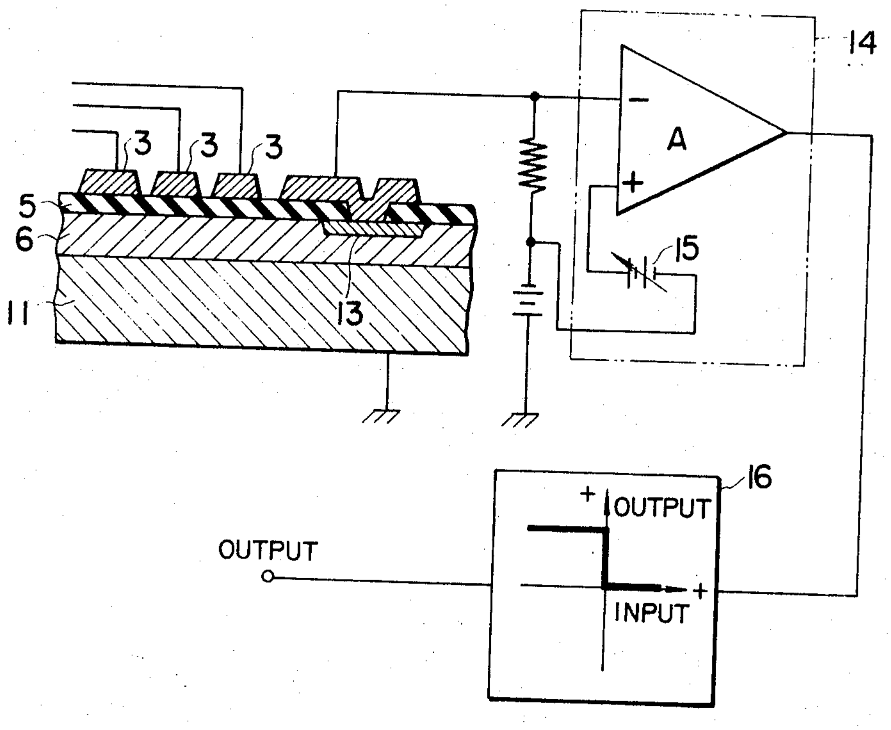
FIG. 5 is a diagrammatic view illustrating a signal charge detector provided with an amplifier, so as to detect the signal charge above a predetermined threshold level among the signal charges transferred through the charge-coupled semiconductor device of the present invention of the type shown in FIG. 4.

First Embodiment, FIGS. 4 and 5

Referring to FIG. 4, illustrating in cross section the first embodiment of a charge-coupled semiconductor device in accordance with the present invention, a semiconductor region or substrate 11 of one polarity is formed below a semiconductor region 6 of the other polarity which, in turn, is formed below transfer electrodes 3 for storing and transferring the charge. According to the present semiconductor techniques, it is easy to fabricate the semiconductor device of the type shown in FIG. 4 by forming upon a semiconductor substrate of one polarity a layer of semiconductive region of the other polarity by epitaxial growth. In the instant embodiment, the semiconductive layer 6 is formed by the expitaxial growth upon the substrate 11. A diffusion layer, into which is injected the signal charge, and other electrodes 4, 1 and 3 may be formed by the conventional semiconductor fabrication techniques.

First Mode of Operation

The first mode of operation is such that when the transfer pulses are applied to the electrodes, a small bias charge is supplied to the surface of the semiconductor below the transfer electrodes, so as to eliminate the traps thereon, thereby compensating the attenuation of the signal charge during transfer. In the instant embodiment, the substrate or semiconductive region 6 is 3.0 microns in thickness and has a density of n-type donor impurities of $1 \times 10^{15}/cm^3$; the control voltage V' (see FIG. 2) is about −10 volts; and the transfer pulses with a voltage slightly higher than the control voltage V' are applied to the electrodes, so as to effect the charge transfer. When the signal charge is not injected, the normalized charge $Q_N$ (see FIG. 2) is almost zero so that the surface potential of the semiconductive region below the electrodes is about −8 volts and the depletion region has a depth of about 3 microns, reaching the semiconductor region 11 which has a a high p-type acceptor density (see FIG. 3). Then, the positive charge (holes) which is supplied through the depletion region to the surface of the semiconductive region 6 eliminates the traps thereupon and is stored, so as to compensate the attenuation of the signal charge being transferred. Therefore, there is no output charge unless the signal charge is injected with the transfer electrodes applied with the pulse voltage higher than −10 volts. When the small signal charge is transferred with the bias charge, only the signal charge is detected at the output terminal. Therefore, the charge carrier transfer efficiency may be greatly enhanced, even when a relatively low transfer pulse voltage is applied.

FIG. 5 shows a diagram of detecting means for detecting, as the output signal, a charge quantity higher than a threshold level. The charge which has been transferred upon the surface of a semiconductive region 6 is derived through a reverse-biased p-n junction 13 and is applied to an amplifier 14 which also functions as a discriminator. The amplified signal is applied to a gate circuit 16, which may be a conventional diode circuit, so that the signal representing only the input signal may be derived. The output voltage $V_I$ derived from the p-n junction 13 may be discriminated by varying the voltage $V_R$ supplied from a variable-voltage DC power source 15. The output voltage $Vo$ is given by $$Vo = -A(V_I - V_R)$$

when $V_I > V_R$, and $$Vo = 0$$

when $V_I \leqq V_R$,
where A = amplification factor of amplifier 14. In summary, the first mode of operation is characterized by the fact that the bias charge may be injected by the transfer pulses.

Second Mode of Operation

In the second mode of operation, immediately before the charge transfer is started, as the signal charge is injected, a voltage higher than the voltage of the charge transfer pulses is applied to all of the transfer electrodes so as to store a suitable charge upon the surface of the semiconductive region 6 immediately below the transfer electrodes, and then the input signal charge is injected. In the instant embodiment, the controlvoltage of about −20 volts is applied to all of the transfer electrodes immediately before the signal charge is injected. Then, as seen from FIGS. 2 and 3, below every transfer electrode 3 is stored the normalized charge $Q_N$ of 0.5, that is, one-half of the maximum charge which may be stored below the transfer electrode 3.

Therefore, when the signal charge corresponding in magnitude to one-half of the maximum storable charge is injected without causing overflow, the charge carrier transfer efficiency may be remarkably increased because of the existence of the previously injected normalized charge of 0.5. The previously injected charge may be arbitrarily selected in terms of $Q_N$ over the range of $0 \leqq Q_N \leqq 1$ by varying the voltage which is applied simultaneously to all of the transfer electrodes immediately before the signal charge is injected. The semiconductive region or substrate 11 is applied with a voltage, so that the minority carriers may be injected across the p-n junction between the semiconductive regions 6 and 11 from the region 11 to the region 6, and is normally grounded.

Figure 6:
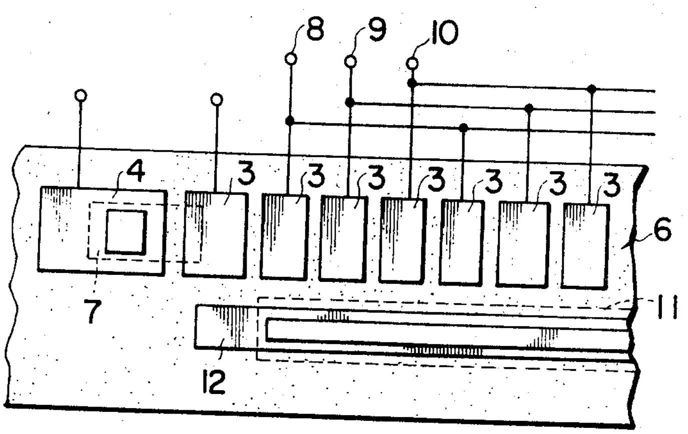
FIG. 6 is a top view of a second embodiment of the present invention.

Second Embodiment, FIG. 6

In the second embodiment of the present invention illustrated in FIG. 6, the semiconductive region 11 of a semiconductive polarity different from that of the semiconductive region 6 is formedupon the surface of the region 6 in parallel with the array of the transfer electrodes 3, and is provided with a metallic electrode 12 in ohmic contact with the semiconductive region 11. As with the first embodiment described hereinbefore, when the depletion region in the semiconductive region 6 below the transfer electrodes reaches the semiconductor region 11, the charge may be stored upon the surface of the semiconductive region 6 below the transfer electrodes 3. The semiconductive device of the second embodiment may be also operated in the first and second modes described above.

Figure 7:
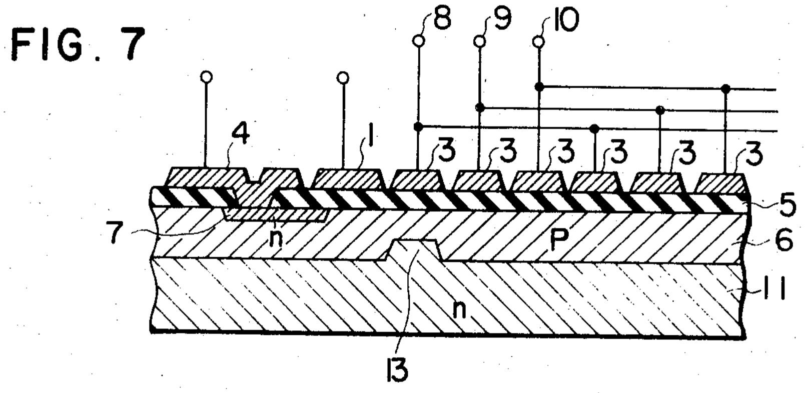
FIG. 7 is a sectional view of a third embodiment of the present invention which is a variation of the device of the type shown in FIG. 4.

Third Embodiment, FIG. 7

The third embodiment illustrated in FIG. 7 is substantially similar in construction to the first embodiment shown in FIG. 4 except that one or a plurality of projections 13 of the semiconductive region or substrate 11 are extended into the semiconductive region 6 in opposed relation with the transfer electrodes 3. Therefore, when the voltage is applied to the transfer electrode 3 and a charge quantity less than a predetermined level is stored on the surface of the semiconductive region 6 below the transfer electrode 3, the depletion region is extended so as to inject and store the charge up to a predetermined magnitude.

Figure 8:
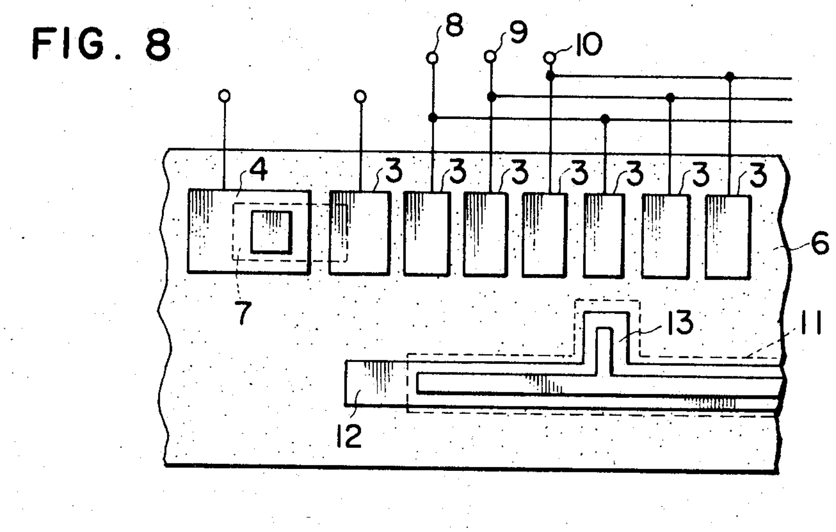
FIG. 8 is a top view of a fourth embodiment of the present invention which is a variation of the semiconductive device of the type shown in FIG. 6.

Fourth Embodiment, FIG. 8

The semiconductive device of the fourth embodiment in accordance with the present invention illustrated in FIG. 8 is substantially similar in construction to the second embodiment shown in FIG. 6 except that at least one projection 13 is extended from the semiconductive region 11 into the semiconductive region 6 with a semiconductive polarity different from that of the region 11. The mode of operation is similar to that of the second embodiment shown in FIG. 6.

Figure 9:
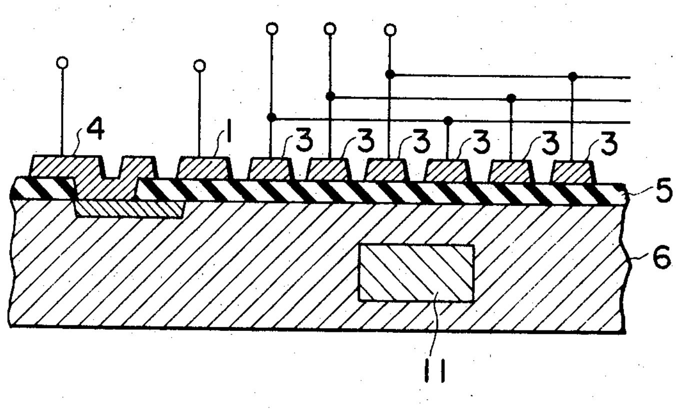
FIG. 9 is a sectional view of a fifth embodiment of the present invention.

Fifth Embodiment, FIG. 9

The semiconductive device shown in FIG. 9 is substantially similar in construction to the first embodiment shown in FIG. 4 except that at least one or a plurality of spaced-apart semiconductive regions 11 are formed in the semiconductive region 6 with a semiconductive polarity different from that of the substrate 11. The mode of operation is substantially similar to that of the first embodiment.

Figure 10:
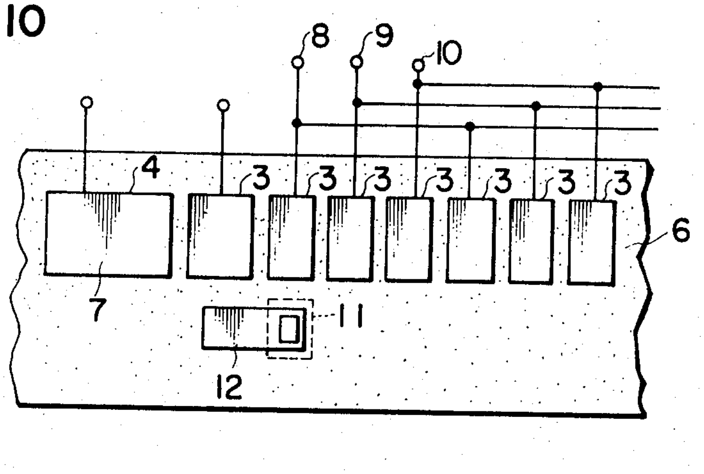
FIG. 10 is a sixth embodiment of the present invention which is another variation of the semiconductive device of the type shown in FIG. 6.

Sixth Embodiment, FIG. 10

The sixth embodiment in accordance with the present invention shown in FIG. 10 is substantially similar in construction to the third embodiment shown in FIG. 7 except that at least one or a plurality of semiconductive regions 11 with a semiconductive polarity different from that of the region 6 are formed upon the surface of the semiconductive region 6. The mode of operation is similar to that of the third embodiment.

It should be noted that only one projection 13 and only one semiconductive region are illustrated in FIGS. 7 and 8 and in FIGS. 9 and 10, respectively, but a plurality of projections or semiconductive regions may be formed and spaced apart by a suitable distance from each other depending upon a desired charge transfer efficiency and a number of transfer electrodes. It should also be noted that the present invention is not limited to the embodiments thereof described hereinbefore and that various modifications and variations can be effected within the scope of the present invention. The essential feature of the present invention may be summarized as follows: the depletion region which is formed in a semiconductive region of one polarity is extended when a predetermined voltage is applied to the transfer electrodes so as to contact with a semiconductive region with the other polarity.

Figure 11:
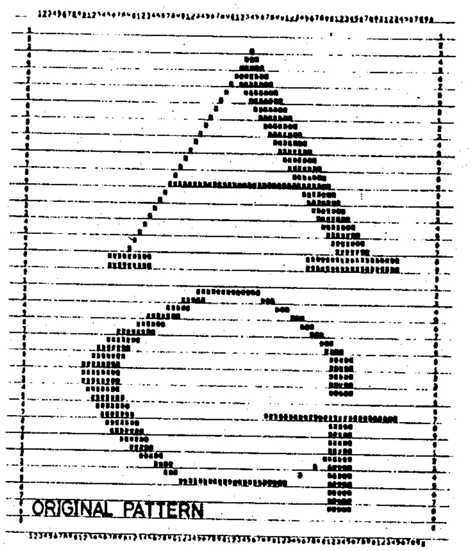
FIG. 11 shows an original pattern to be transferred through an image transfer or transmission system with or without the charge-coupled semiconductor devices in accordance with the present invention in order to explain the novel features and advantages thereof.
Figure 12:
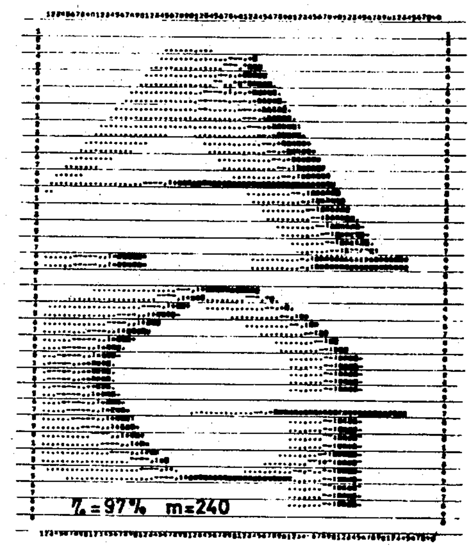
FIG. 12 shows a pattern reproduced by an image transfer or transmission system of the type employing the prior art charge-coupled semiconductor devices.
Figure 13:
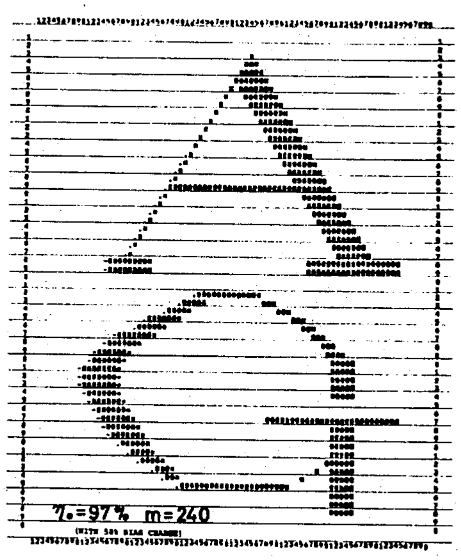
FIG. 13 shows a pattern reproduced by an image transfer or transmission system of the type employing the charge-coupled semiconductive devices in accordance with the present invention.

Pattern Transmission, FIGS. 11, 12 and 13

Next, a pattern transmission system using the charge-coupled semiconductor devices in accordance with the present invention will be described. The original pattern AG shown in FIG. 11 is divided into a large number of picture elements or elementary areas in the manner well known in the art. The black picture elements are represented by the binary codes 1's whereas the white picture elements, by 0's. As shown in FIG. 11, 60 charge-coupled semiconductor devices each having 240 transfer electrodes are arrayed in 60 rows. The output signals derived from the rows of the charge-coupled semiconductive devices are applied to the 60 rows of the similar devices, respectively, so as to reproduce the original pattern as shown in FIG. 13. FIG. 12 shows a pattern reproduced by a pattern transmission system of the type not employing the charge-coupled semiconductor devices in accordance with the present invention, but the 240 charge-coupled semiconductive devices with the charge carriers transfer efficiency $\eta_o$=97% when the maximum charge $Q_M$ is transferred once. It is seen that the reproduced pattern is blurred or " out of focus." In the pattern reproduction system shown in FIG. 13, the charge-coupled semiconductive devices in accordance with the present invention have the charge transfer efficiency, the same and that of the devices shown in FIG. 12, and the charge quantity one-half of the maximum charge $Q_M$ is previously stored below each of the transfer electrodes, and the signal charge equal to one-half of the maximum charge $Q_M$ is injected and transferred. It is seen that the reproduced pattern is substantially similar to the original pattern shown in FIG. 11 in every respect because of the novel features of the present invention.

In the above embodiments of the present invention, the three-phase charge transfer electrodes are used and described, but it is understood that the present invention may also be applied to the so-called "bucket-brigade" type charge-coupled semiconductor devices provided with a plurality of two-phase or four-phase charge transfer electrodes. As to the construction of the above charge-coupled semiconductive devices, references are made to "Charge-Coupled Digital Circuits," IEEE ISSCC, Digest of Technical Papers, 1971, pages 162–163, and to "Integrated MOS and Bipolar Analog Delay Line Using Bucket-Brigate Capacitor Storage," IEEE ISSCC, Digest of Technical Papers, 1970, pages 74–75.

What is claimed is:

1. A charge-coupled semiconductor device provided with biasing charges comprising:

a semiconductor body of a first conductivity type;

a layer of insulating material disposed on a first surface of said semiconductor body;

first means, coupled to said semiconductor body, for injecting charge carriers into said semiconductor body;

a plurality of electrodes disposed on the surface of said layer of insulating material;

second means, coupled to said semiconductor body, for detecting charge carriers transferred thereto;

a second body made of a material selected from the group consisting of a semiconductor and a conductor, on which said semiconductor body is disposed, and which defines a rectifying junction with said semiconductor body;

third means for applying pulse voltages to said electrodes, so as to transfer said injected charge carriers along the interface between said semiconductor body and said layer of insulating material, the pulse voltages being of sufficient magnitude to form depletion regions, the edges of which come into contact with said rectifying junction, when the quantity of charge stored in said interface is less than a predetermined normalized charge, so that charge carriers are injected from said second body into a portion of said interface adjacent at least one of said electrodes, until the quantity of charge stored in said interface reaches a predetermined level.

2. A charge-coupled semiconductor device provided with biasing charges as claimed in claim 1, wherein said second means comprises means for providing a detection output signal only when the quantity of carriers transferred thereto exceeds a threshold value.

3. A charge-coupled semiconductor device provided with biasing charges as claimed in claim 1, wherein said second body includes a semiconductor region of a second conductivity type opposite said first conductivity type, contacting said semiconductor body and forming a p-n junction therewith at a portion of said semiconductor body spaced apart from at least one of said electrodes.

4. A charge-coupled semiconductor device provided with biasing charges as claimed in claim 3, wherein said semiconductor region comprises a layer of semiconductor material which extends beneath each electrode of said plurality, thereby forming a p-n junction with said semiconductor body extending beneath said plurality of electrodes.

5. A charge-coupled semiconductor device provided with biasing charges as claimed in claim 4, wherein said semiconductor layer is grounded.

6. A charge-coupled semiconductor device provided with biasing charges as claimed in claim 4, wherein said semiconductor layer has a portion thereof which projects into said semiconductor body beneath one of said electrodes, whereby the separation between the portion of said semiconductor body beneath said one of said electrodes and said p-n junction is less than the separation between the portion of said semiconductor body beneath other ones of said electrodes and said p-n junction.

7. A charge-coupled semiconductor device provided with biasing charges as claimed in claim 3, wherein said semiconductor region comprises a layer of semiconductor material disposed in said semiconductor body which extends alongside each electrode of said plurality, thereby forming a p-n junction with said semiconductor body extending alongside said plurality of electrodes.

8. A charge-coupled semiconductor device provided with biasing charges as claimed in claim 7, further including a metallic electrode contacting said layer of semiconductor material.

9. A charge-coupled semiconductor device provided with biasing charges as claimed in claim 7, wherein said layer of semiconductor material has a portion thereof which projects toward one of said electrodes, whereby the separation between the portion of said semiconductor body beneath said one of said electrodes and said p-n junction is less than the separation between the portion of said semiconductor body beneath other ones of said electrodes and said p-n junction.

10. A charge-coupled semiconductor device provided with biasing charges as claimed in claim 9, further including a metallic electrode contacting said layer of semiconductor material and having a projecting portion disposed over the portion of said semiconductor layer which projects toward said one electrode.

11. A charge-coupled semiconductor device provided with biasing charges as claimed in claim 3, wherein said semiconductor region comprises at least one embedded semiconductor region disposed in said semiconductor body beneath at least one of said electrodes.

12. A charge-coupled semiconductor device provided with biasing charges as claimed in claim 11, wherein said at least one embedded semiconductor region comprises a plurality of embedded regions.

13. A charge-coupled semiconductor device provided with biasing charges as claimed in claim 3, wherein said semiconductor region comprises at least one layer of semiconductor material disposed in said first surface of said semiconductor body alongside at least one of said electrodes of said plurality.

14. A charge-coupled semiconductor device provided with biasing charges as claimed in claim 13, further including a respective metallic electrode in ohmic contact with said at least one layer of semiconductor material.

15. A charge-coupled semiconductor device provided with biasing charges comprising:

a semiconductor body of a first conductivity type;

a layer of insulating material disposed on a first surface of said semiconductor body;

first means, coupled to said semiconductor body, for injecting charge carriers into said semiconductor body;

a plurality of electrodes disposed on the surface of said layer of insulating material;

second means, coupled to said semiconductor body, for detecting charge carriers transferred thereto;

third means for applying pulse voltages to said electrodes, so as to transfer said injected charge carriers along the interface between said semiconductor body and said layer of insulating material;

a second body made of a material selected from the group consisting of a semiconductor and a conductor, on which said semiconductor body is disposed, and which defines a rectifying junction with said semiconductor body;

fourth means, for applying a second voltage to said electrodes, the second voltage being sufficiently large to form depletion regions the edges of which come into contact with said rectifying junction, so that charge carriers are injected from said second body into a portion of said interface adjacent at least one of said electrodes and are accumulated as biasing charge carriers therein.

16. A charge-coupled semiconductor device provided with biasing charges comprising:

a semiconductor body of a first conductivity type;

a layer of insulating material disposed on a first surface of said semiconductor body;

a plurality of electrodes disposed on the surface of said layer of insulating material;

first means, coupled to said semiconductor body, for detecting charge carriers which have been transferred beneath said plurality of electrodes;

a second body made of a material which forms a rectifying junction with said semiconductor body, disposed in contact with said semiconductor body, but displaced from the portion of the first surface of said semiconductor body beneath said plurality of electrodes;

second means, coupled to said semiconductor body, for injecting charge carriers into said semiconductor body; and third means for applying first and second voltages to said plurality of electrodes, said first voltage being a control voltage having a first predetermined magnitude, and said second voltage being a pulse voltage having a second predetermined magnitude sufficient to effect the transfer of injected charge carriers along the interface between said semiconductor body and said layer of insulating material, and wherein the sum of said first and second predetermined voltage magnitudes is at least sufficient to form a depletion region beneath a respective electrode to which said first and second voltages are applied, which depletion region extends to come in contact with said rectifying junction, so as to inject charge carriers from said second body into that portion of said interface adjacent said respective electrode as bias charge carriers to be added to the charge carriers injected by said second means.

17. A charge coupled semiconductor device provided with biasing charges according to claim 16, wherein said third means includes means for applying a D.C. voltage as said control voltage to all of the electrodes of said plurality, immediately prior to the injection of charge carriers by said second means, so as to store a bias charge beneath each electrode.

18. A charge coupled semiconductor device provided with biasing charges according to claim 16, wherein said first predetermined voltage magnitude of said control voltage is greater than said second predetermined voltage magnitude of said voltage pulses.

19. A charge coupled semiconductor device provided with biasing charges according to claim 16, wherein said third means includes means for applying a D.C. voltage as said control voltage to all of the electrodes of said plurality, immediately prior to the application of voltage pulses for transferring charge carriers thereby.

20. A charge coupled semiconductor device provided with biasing charges according to claim 16, wherein said second body comprises a semiconductor region having a second conductivity type opposite said first conductivity type extending beneath said plurality of electrodes.

21. A charge coupled semiconductor device provided with biasing charges according to claim 16, wherein said second body comprises a semiconductor region having a second conductivity type opposite said first conductivity type extending along side each electrode of said plurality, thereby forming said rectifying junction at said first surface of said semiconductor body laterally displaced from said electrodes.

* * * * *